United States Patent
Redpath et al.

(10) Patent No.: US 9,532,621 B2
(45) Date of Patent: Jan. 3, 2017

(54) HELMET CONFIGURED FOR ELECTRONICS

(71) Applicant: Revision Military S.a.r.L., Luxembourg (LU)

(72) Inventors: David Redpath, Beaconsfield (CA); Marie-Pierre Gendron, Mercier (CA); Stéphane Lebel, St. Redempteur (CA)

(73) Assignee: Revision Military S.a.r.L., Luxembourg (LU)

( * ) Notice: Subject to any disclaimer, the term of this patent is extended or adjusted under 35 U.S.C. 154(b) by 0 days.

(21) Appl. No.: 14/792,848

(22) Filed: Jul. 7, 2015

(65) Prior Publication Data
US 2015/0305425 A1 Oct. 29, 2015

Related U.S. Application Data

(62) Division of application No. 13/536,528, filed on Jun. 28, 2012, now Pat. No. 9,101,175.

(51) Int. Cl.
| | |
|---|---|
| *A42B 3/04* | (2006.01) |
| *H05K 13/00* | (2006.01) |
| *H05K 3/40* | (2006.01) |
| *H05K 1/02* | (2006.01) |
| *A42C 2/00* | (2006.01) |

(52) U.S. Cl.
CPC .............. *A42B 3/042* (2013.01); *A42B 3/04* (2013.01); *A42C 2/00* (2013.01); *H05K 1/028* (2013.01); *H05K 3/40* (2013.01); *H05K 13/00* (2013.01); *Y10T 29/49002* (2015.01)

(58) Field of Classification Search
CPC ............ H02J 5/005; A42B 1/244; A42B 3/04; A42B 3/0406; A42B 3/046; A42B 1/245; A42B 3/0433; A42B 3/044; A42B 3/0446; A42B 3/127; A42B 3/286; F41H 1/04; H05K 7/14; G02B 27/017; G02B 2027/014; G02B 27/0093; G02B 2027/0138; G02B 2027/0187; G06F 3/013; G06F 3/005; G06F 1/163; G06F 3/012
USPC ...... 361/810; 2/410; 362/106, 190; 224/181; 345/8
See application file for complete search history.

(56) References Cited

U.S. PATENT DOCUMENTS

| | | | |
|---|---|---|---|
| 3,845,389 A | 10/1974 | Phillips et al. | |
| 5,416,922 A * | 5/1995 | Horvat et al. | ..................... 2/6.2 |
| 5,485,358 A * | 1/1996 | Chien | ........................ 362/106 |
| 5,758,947 A * | 6/1998 | Glatt | ..................... A42B 3/044 |
| | | | 362/105 |
| 5,871,271 A * | 2/1999 | Chien | ........................ 362/106 |
| 6,007,213 A * | 12/1999 | Baumgartner | ............... 362/106 |
| 6,244,721 B1 * | 6/2001 | Rodriguez et al. | .......... 362/106 |

(Continued)

*Primary Examiner* — Courtney Smith
*Assistant Examiner* — Michael Matey
(74) *Attorney, Agent, or Firm* — Wolf, Greenfield & Sacks, P.C.

(57) ABSTRACT

Integrated helmet systems provide convenient and modular use of electronic devices with a protective helmet. In addition to ease of use, weight savings and space savings also may be realized in certain embodiments. A flexible printed circuit board is used as a power bus to deliver electrical power from a battery pack to various electronic devices. Examples of devices used with protective helmets include: night vision goggles; helmet-mounted display units; ear phones; communication headsets; camera systems; biometric sensors; microprocessors; identify friend or foe devices (IFFs); and GPS devices.

18 Claims, 7 Drawing Sheets

(56) References Cited

U.S. PATENT DOCUMENTS

| | | | |
|---|---|---|---|
| 6,560,029 B1 | 5/2003 | Dobbie et al. | |
| 6,701,535 B2 | 3/2004 | Dobbie et al. | |
| 6,931,668 B2 | 8/2005 | Dobbie et al. | |
| 7,107,624 B2 | 9/2006 | Dobbie et al. | |
| 7,845,816 B2 | 12/2010 | Lombard et al. | |
| 7,963,426 B2* | 6/2011 | Gruebel et al. | 224/181 |
| 7,992,421 B2* | 8/2011 | Jeftic-Stojanovski et al. | 73/12.04 |
| 8,020,220 B2 | 9/2011 | McElroy et al. | |
| 8,192,043 B2 | 6/2012 | Lombard | |
| 8,529,082 B1* | 9/2013 | Baker et al. | 362/105 |
| 9,101,175 B2 | 8/2015 | Redpath et al. | |
| 2006/0202629 A1* | 9/2006 | Colwell | 315/119 |
| 2007/0214551 A1* | 9/2007 | Teetzel | A42B 3/04 2/422 |
| 2009/0126059 A1* | 5/2009 | Tack | A42B 3/04 2/2.5 |
| 2011/0069476 A1* | 3/2011 | Lombard | 362/105 |
| 2011/0145978 A1 | 6/2011 | Harbin | |
| 2011/0170280 A1* | 7/2011 | Soto et al. | 362/105 |
| 2012/0224356 A1* | 9/2012 | Fischer et al. | 362/106 |
| 2012/0317706 A1* | 12/2012 | Lebel et al. | 2/422 |
| 2013/0033610 A1* | 2/2013 | Osborn | 348/207.1 |
| 2013/0056248 A1* | 3/2013 | Kajiya | H05K 1/028 174/254 |
| 2013/0086722 A1* | 4/2013 | Teetzel et al. | 2/2.5 |
| 2013/0192961 A1* | 8/2013 | Waters | 200/43.18 |
| 2013/0192962 A1* | 8/2013 | Engesser et al. | 200/50.01 |
| 2013/0201299 A1* | 8/2013 | Waters | 348/49 |
| 2014/0020159 A1* | 1/2014 | Teetzel et al. | 2/422 |

\* cited by examiner

HELMET CONFIGURED FOR ELECTRONICS

RELATED APPLICATIONS

This Application is a divisional application and claims the benefit under 35 U.S.C. §120 of U.S. application Ser. No. 13/536,528, entitled "HELMET CONFIGURED FOR ELECTRONICS" filed on Jun. 28, 2012, which is herein incorporated by reference in its entirety, and is now published as U.S. Pat. Apl. Publ. No. 2014-0000013.

FEDERALLY SPONSORED RESEARCH

This invention was made with government support under W911QY11C0046 awarded by the Department of Defense. The government has certain rights in the invention.

FIELD

The present invention relates generally to protective helmets, and more specifically to protective helmets configured to incorporate electronic devices and components.

DISCUSSION OF THE RELATED ART

Protective helmets are commonly worn by military and law enforcement personnel to protect the head and face from various types of injuries, including ballistic and impact injuries. Electronic devices such as night vision goggles, helmet-mounted display units, camera systems, sensors and other components are being used more and more with today's advanced protective helmets. These electronic components have power needs and in many cases also transfer data to and/or from the component.

SUMMARY

According to one embodiment of the invention, a protective helmet includes a protective assembly to protect a wearer's head, a first connector to physically connect an electrical power source to the helmet, and a first contact to receive electrical power from the power source. The protective helmet also includes a flexible printed circuit board forming a power bus, the first contact being electrically connected to the flexible printed circuit board to provide electrical power to the flexible printed circuit board when the electrical power source is connected to the first contact. One or more component contacts are electrically connected to the flexible printed circuit board, each of the component contacts being configured to deliver electrical power to an electronic component when the electronic component is connected to the component contact.

According to another embodiment of the invention, a method of manufacturing a protective helmet includes acts of: providing protective helmet assembly components and a flexible printed circuit board; forming the flexible printed circuit board into a shape to match a contour of one or more of the protective helmet assembly components; and positioning the flexible printed circuit board on the one or more protective helmet components.

According to a further embodiment of the invention, a protective helmet includes a protective assembly to protect a wearer's head, a first connector to physically connect an electrical power source to the helmet, and a first contact to receive electrical power from the power source. The protective helmet also includes a power bus, with the first contact being electrically connected to the power bus to provide electrical power to the power bus when the electrical power source is connected to the first contact. A first component contact is electrically connected to the power bus at a first location on the helmet, the first component contact being configured to deliver electrical power to a first electronic component when the first electronic component is connected to the first component contact. A second component contact is electrically connected to the power bus at a second location on the helmet which is spaced from the first location, the second component contact being configured to deliver electrical power to a second electronic component when the second electronic component is connected to the second component contact.

According to yet another embodiment of the invention, a protective helmet includes a protective assembly to protect a wearer's head and a first contact to send and/or receive data with a device external to the protective assembly. The protective helmet additionally includes a flexible printed circuit board forming a data bus, with the first contact being conductively connected to the flexible printed circuit board to provide data to and/or receive data from the flexible printed circuit board when the external device is operatively connected to the first contact. One or more component contacts are conductively connected to the flexible printed circuit board, with each of the component contacts being configured to send data to and/or receive data from an electronic component when the electronic component is connected to the component contact.

Various embodiments of the present invention provide certain advantages. Not all embodiments of the invention share the same advantages and those that do may not share them under all circumstances. Further features and advantages of the present invention, as well as the structure of various embodiments that incorporate aspects of the invention are described in detail below with reference to the accompanying drawings.

BRIEF DESCRIPTION OF DRAWINGS

The foregoing and other features and advantages of the invention will be appreciated more fully from the following drawings, wherein like reference characters designate like features, in which.

DETAILED DESCRIPTION

Applicants have recognized that with the increasing use of electronic devices on protective helmets, the provision and transmission of electrical power can be problematic in terms of space, weight and ease of use. For example, a helmet with night vision goggles mounted to the front of the helmet and a battery pack mounted to the rear of the helmet typically includes a power transmission cable which arrangements along the outside or the inside of the helmet. For exterior cable arrangements, an exposed cable can present a snag hazard. Interior cable arrangements can needlessly occupy space, especially when a helmet is wired for a large number of electronic components.

Embodiments disclosed herein provide an integrated helmet system whereby power and/or data transmission may permit reduced weight, reduced space requirements, enhanced electromagnetic shielding, and/or simplified modularity in terms of adding or removing electronic devices from the helmet in the field. Using embodiments disclosed herein in which power and data may be delivered in an improved manner, the location and mounting arrangements of electronic devices on a helmet may be improved.

A flexible printed circuit board is used in some embodiments as a power bus to deliver electrical power from a battery pack or other power source to various electronic devices. Examples of electronic devices used with protective helmets include, but are not limited to: night vision goggles; helmet-mounted display units; ear phones; communication headsets; biometric sensors; microprocessors; identify friend or foe devices (IFFs); and GPS devices. By providing a power delivery arrangement which does not require cables and large cable connectors, it is possible in some embodiments to reduce the number of separate power sources on a helmet, resulting in further weight and space savings. For example, certain conventional night vision goggle units have their own battery pack mounted within the unit itself, adding not only weight, but a not insignificant moment arm to the wearer's neck. In such arrangements, additional weight may be added to the rear of the helmet to counteract the moment arm, but the counterbalance of course increases the overall weight of the headwear system. In some embodiments disclosed herein, a single battery pack is used to power numerous electronic devices obviating the weight, size and/or snag hazard factors associated with the conventional approaches.

The ability to easily attach and detach electronic devices is enabled by certain embodiments disclosed herein. By having certain types of connectors, such as pin or socket connectors, embedded in the helmet, physical and electrical connection can be performed simultaneously. For example, a helmet-mounted display unit connector may be inserted into a connector mounted on a downwardly facing surface of the helmet rim such that the helmet-mounted display unit is mounted to the helmet as part of the same action that connects the helmet-mounted display unit to the power bus.

Figure 1:
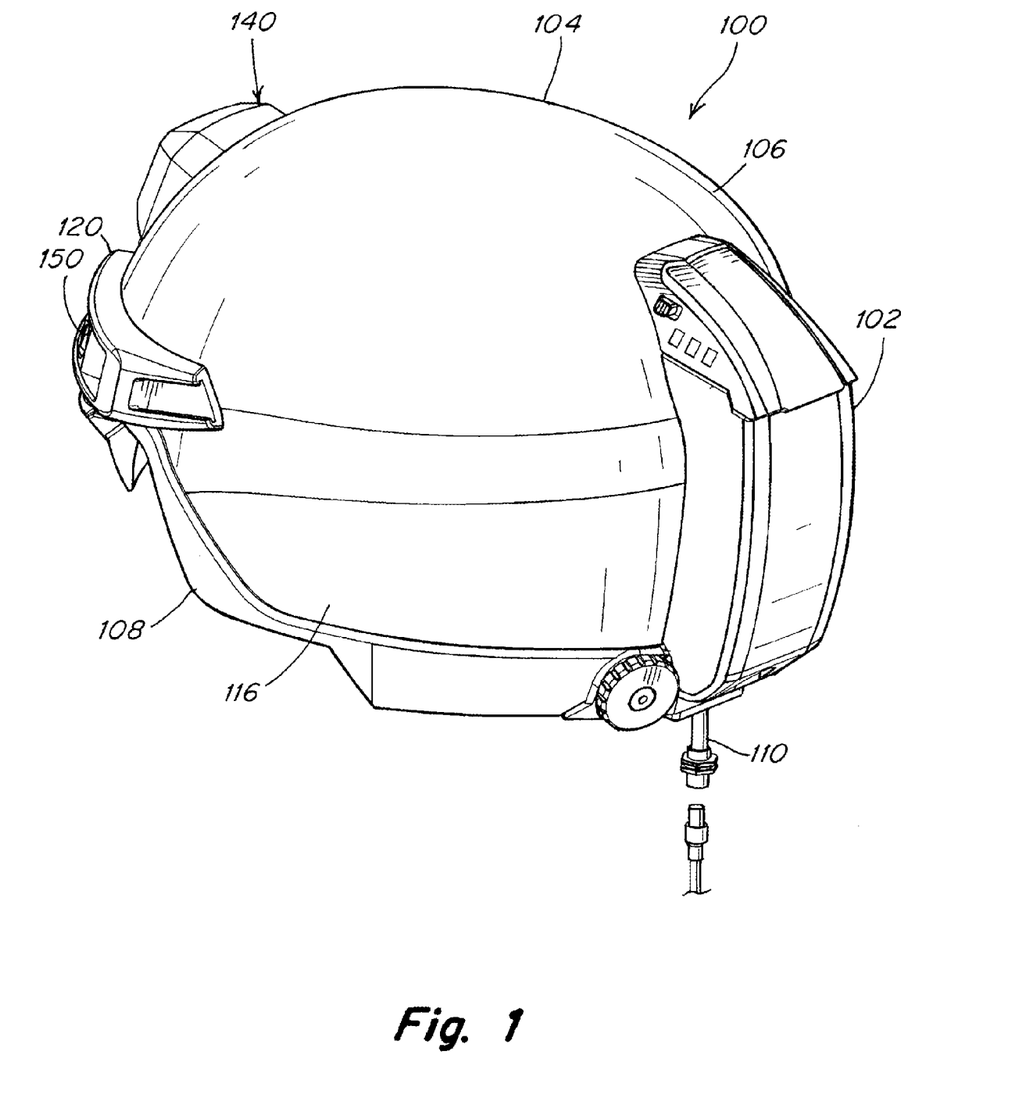
FIG. 1 is a top, right, rear perspective view of a helmet assembly according to one embodiment.
Figure 3A:
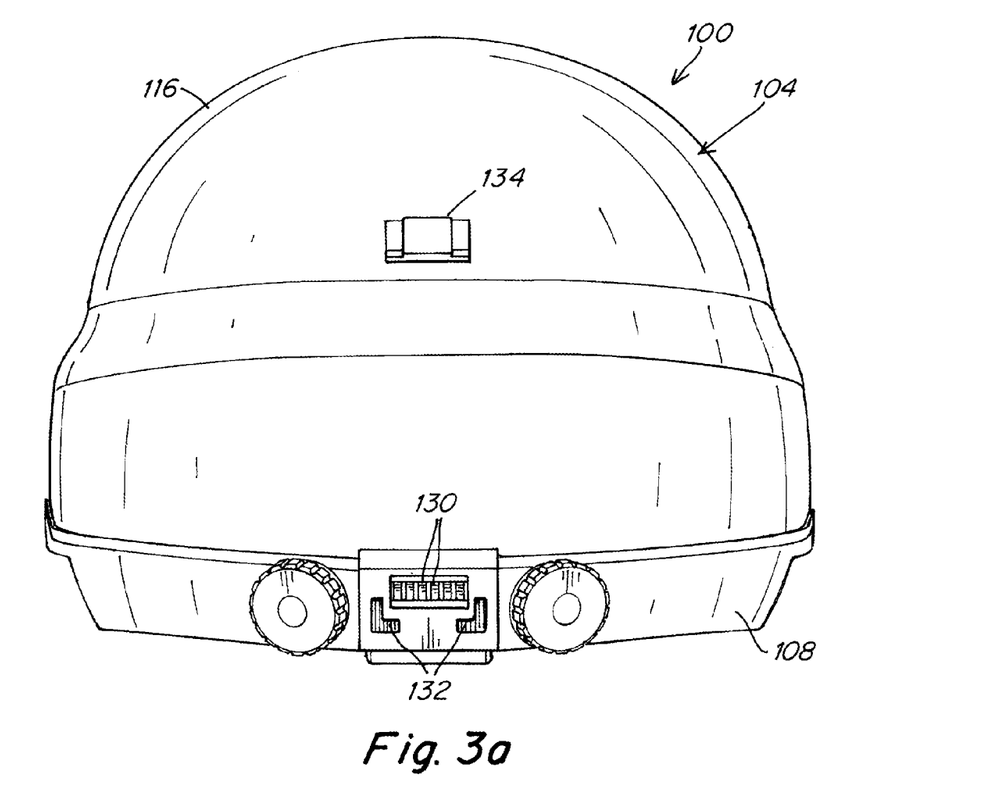
FIG. 3a is a rear view of a helmet including a battery mounting arrangement according to one embodiment.
Figure 3B:
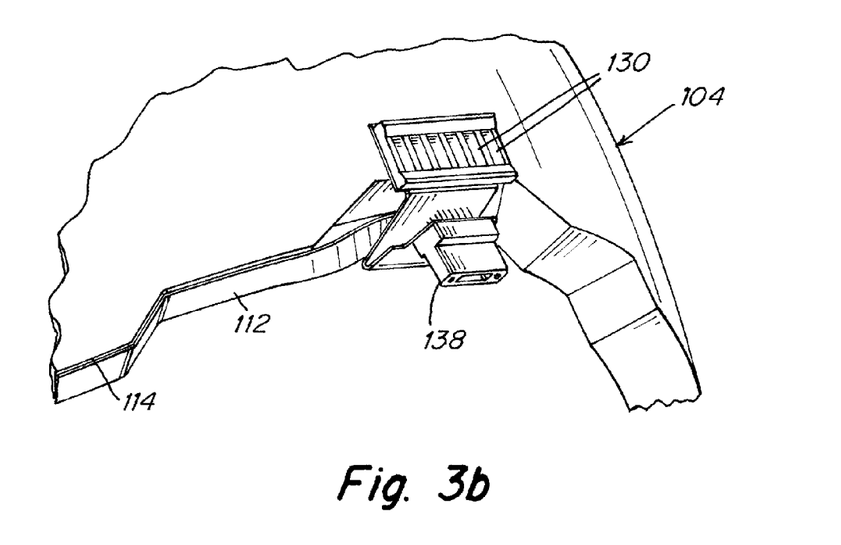
FIG. 3b shows a battery contact and an electrical connector for a data cable according to one embodiment.

FIG. 1 shows one embodiment of a helmet assembly 100 including a battery assembly 102, a helmet 104 with a protective assembly 106 and an edge trim 108, and a data cable 110 extending from the helmet. The protective assembly 106 may include one or more typical helmet components such as a protective shell 116, a liner, an interior air cushion, etc., which work in conjunction with one another to protect a wearer's head. Battery assembly 102 includes a removable pack which houses a rechargeable battery in some embodiments, though disposable batteries may be used. Battery assembly 102 and alternative embodiments of battery assemblies are described below with reference to FIG. 3.

Additional protective components (whether electronic or not) may be included with helmet assembly 100. For example, a removable or permanent mandible guard may be added to the helmet. Eye protection may be included in the form of a visor that is movable between an operational position and a non-operational position. Additional protective components and other helmet accessories may be included as the invention is not limited to particular component arrangements unless specifically recited in the claims.

Figure 2A:
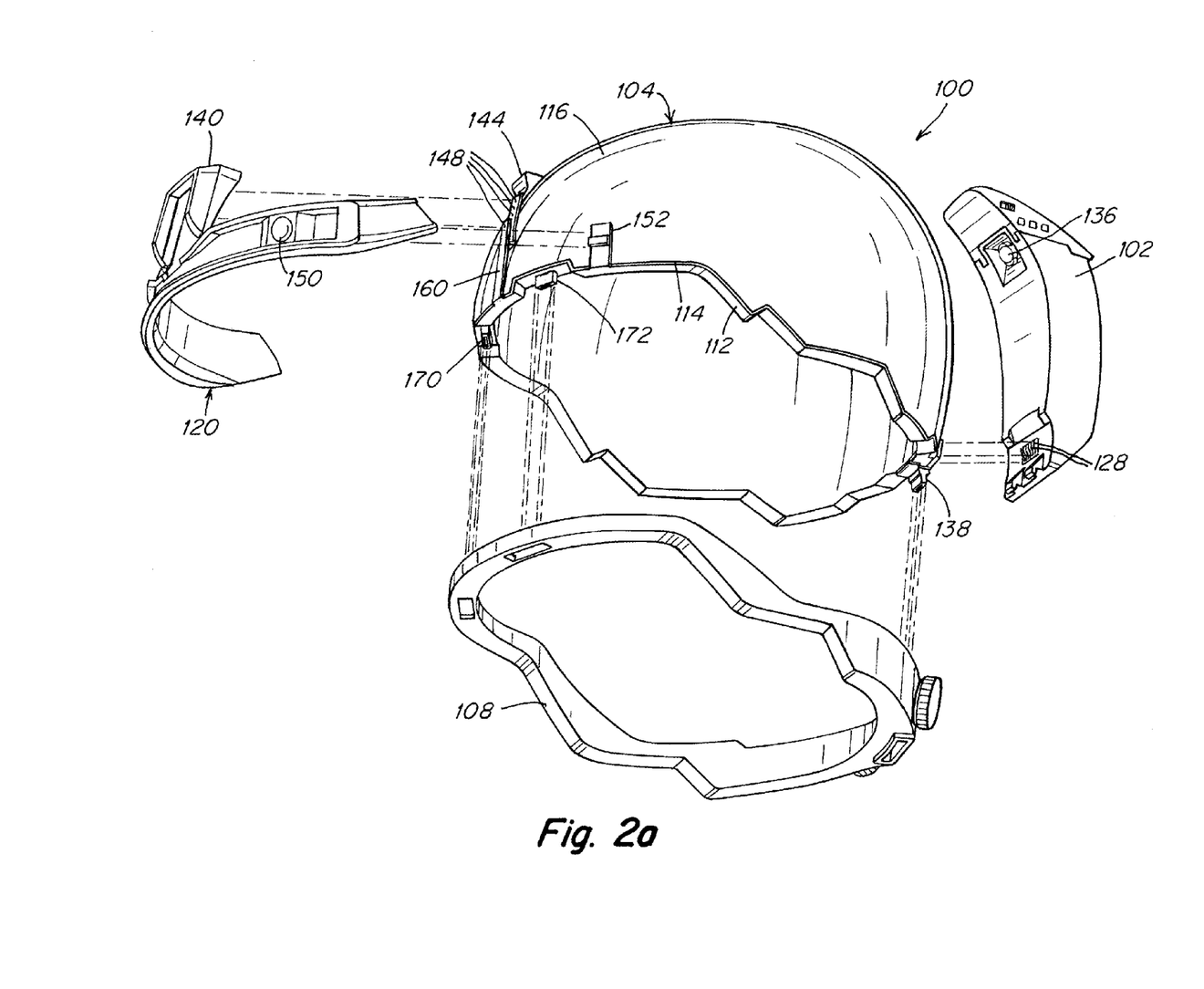
FIG. 2a is an exploded bottom, right front perspective view of helmet components according to one embodiment.

A flexible printed circuit board 112 is incorporated into helmet 104. The flexible printed circuit board may be associated with a rim 114 of protective shell 116 as shown in FIG. 2. Printed circuit board 112 may be sandwiched between protective shell 116 and an edge trim 108 such as an edge halo. The edge trim is shown removed from the helmet assembly for ease of illustration, but once affixed to the helmet assembly, edge trim is typically not removed by the user. Although shown extending completely around the helmet, the trim may extend only partially around the helmet as should be apparent to one of skill in the art. A front halo 120 also is shown removed from the helmet for ease of viewing the particular location of flexible printed circuit board 112 in the embodiment of FIG. 2.

Flexible printed circuit board 112 may be incorporated with helmet 104 in other manners. For example, the flexible printed circuit board may travel along the inside or outside of the helmet from the rear to the front by passing over the top of the helmet. The flexible printed circuit board may be conformed to the protective shell, and then covered with adhesives and/or other materials to protect and shield the circuitry from physical damage and/or electromagnetic interferences. In other embodiments, where the battery pack assembly is mounted on the side of the helmet, or within the top of the helmet, the flexible printed circuit board may include multiple branches or extensions which follow various paths throughout the helmet to reach component connectors and/or contacts.

A recess, trough, or internal bore in one or more helmet components may be used to house the flexible printed circuit board. For example, a downwardly-facing surface of the helmet rim may include a recessed area where the flexible printed circuit board is positioned. In this manner, when the edge trim is placed over the helmet rim, the edge trim may place limited forces on the flexible printed circuit board.

One example of a type of flexible printed circuit board which may be used with embodiments described herein includes a double row, through hole, vertical mount printed circuit board. In a finished protective helmet assembly, the flexible printed circuit board of course is not typically bent or flexed to any great degree, as the term "flexible" refers to the ability to form the printed circuit board into a specific shape that is not entirely planar. In some embodiments, the act of forming the printed circuit board into such a shape is performed by heating the printed circuit board until sufficiently pliable, and then pressing the printed circuit board against a helmet component to shape the printed circuit board to conform to the helmet component. The printed circuit board may be pressed against an underside of a protective shell rim, and more specifically against the underside of the rim along a side of the helmet, as shown in FIG. 2a, though other suitable locations may be used.

Figure 2B:
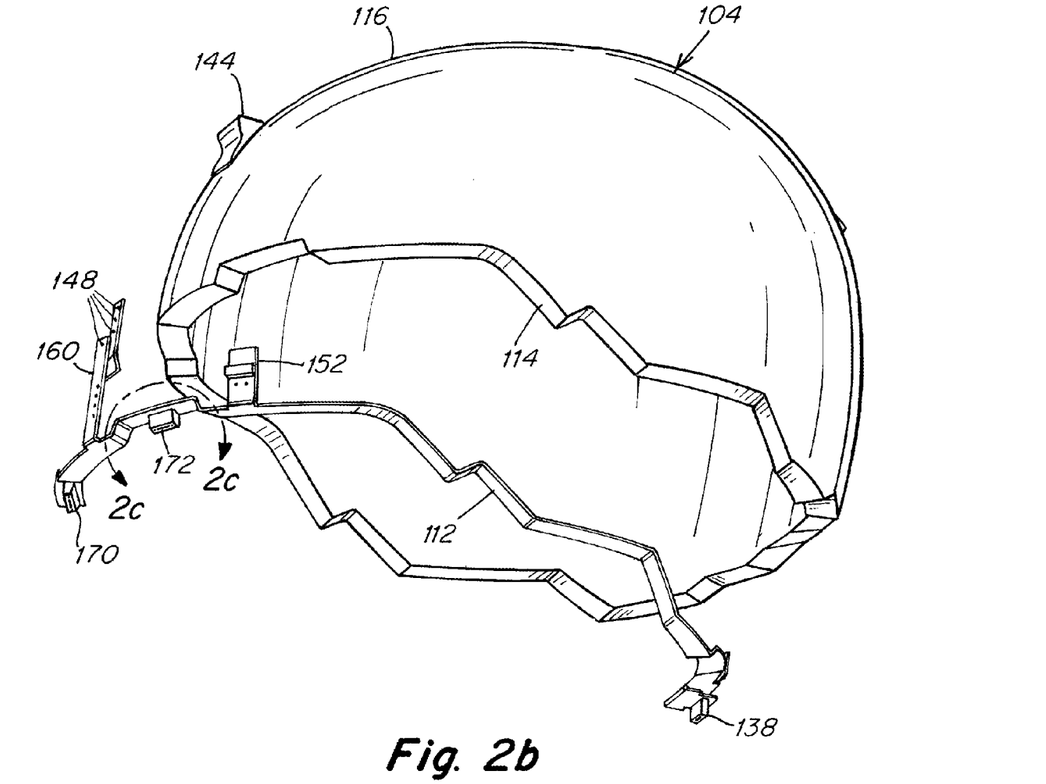
FIG. 2b shows a flexible printed circuit board apart from a protective shell according to one embodiment.
Figure 2C:
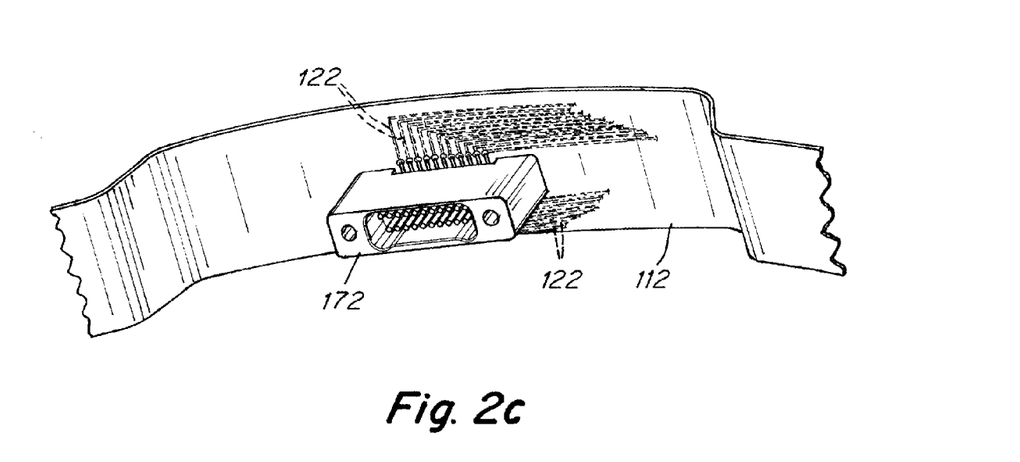
FIG. 2c shows an electrical connector attached to channels on a flexible printed circuit board according to one embodiment.

FIG. 2b shows flexible printed circuit board 112 removed from protective shell 116. FIG. 2c shows one embodiment of a pin connector 172 connected to conductive leads 122 on printed circuit board 112, though of course other arrangements are possible. For example, various conductive leads may bypass connector 172, and/or conductive leads may link connector 172 to other connectors.

Another method of forming the flexible printed circuit board into a desired shape includes creating a master mold against which the pliable board is pressed. Once cooled and resilient, the printed circuit board is adhered or otherwise attached to a helmet component, such as the protective shell.

A flexible printed circuit board may be provided in a helmet for use as a power and data bus in some embodiments, while in other embodiments the printed circuit board may be used as a power bus only. In still further embodiments, the printed circuit board may be used as a data bus only. For purposes herein, a "power and/or data bus" refers to any of: a power bus that transmits only power; a data bus that transmits only data; and a bus that transmits both data and power. Similarly, if a component is described as capable of transmitting power and/or data, the component does not necessarily have to be able to transmit both power and data. The component may be capable of transmitting only power or only data.

One particular mounting arrangement for battery assembly 102 is shown in FIGS. 3a and 3b. Embodiments disclosed herein may use a battery pack assembly and mounting configuration such as one shown in an application entitled "Battery Pack and Helmet Mounting Arrangement" filed on even date herewith, and incorporated herein by reference in its entirety. In some embodiments, battery pack 102 has tabs which are received in slots 132. The battery pack is locked to the helmet using an engaging member 134 which receives a locking member 136 positioned on the battery pack (see FIG. 2a). In some embodiments, the battery pack assembly may be integral with the helmet and/or configured to typically not be removed by a wearer. In such embodiments, the helmet would be considered as having a connector to physically connect the battery pack assembly to the helmet.

Multiple battery assemblies may be used, and battery assemblies may be mounted or integrated in locations other than the center rear of the helmet. In some embodiments, the entire battery assembly may be removable, while in other embodiments, a battery housing may typically remain attached to the helmet, and a battery or batteries are removable from the housing for replacement or charging.

Battery contacts 130 are positioned at the base of the rear of the helmet. Battery contacts 130 are brought into contact with corresponding contacts 128 on battery assembly 102 when the battery assembly is mounted to the helmet. Battery contacts 130 are in electrical connection with flexible printed circuit board 112 to connect power from the batteries to the flexible printed circuit board. In some embodiments, the battery contacts are formed on the printed circuit board itself, and such an arrangement is considered to include a battery contact in electrical connection with the printed circuit board. The batteries may include lithium ion polymer cells in some embodiments, though any suitable battery technology may be used.

An electrical connector 138 may be positioned at the rear of the helmet (or any other suitable location) to attach a data cable or other data transfer component to the helmet.

Figure 4:
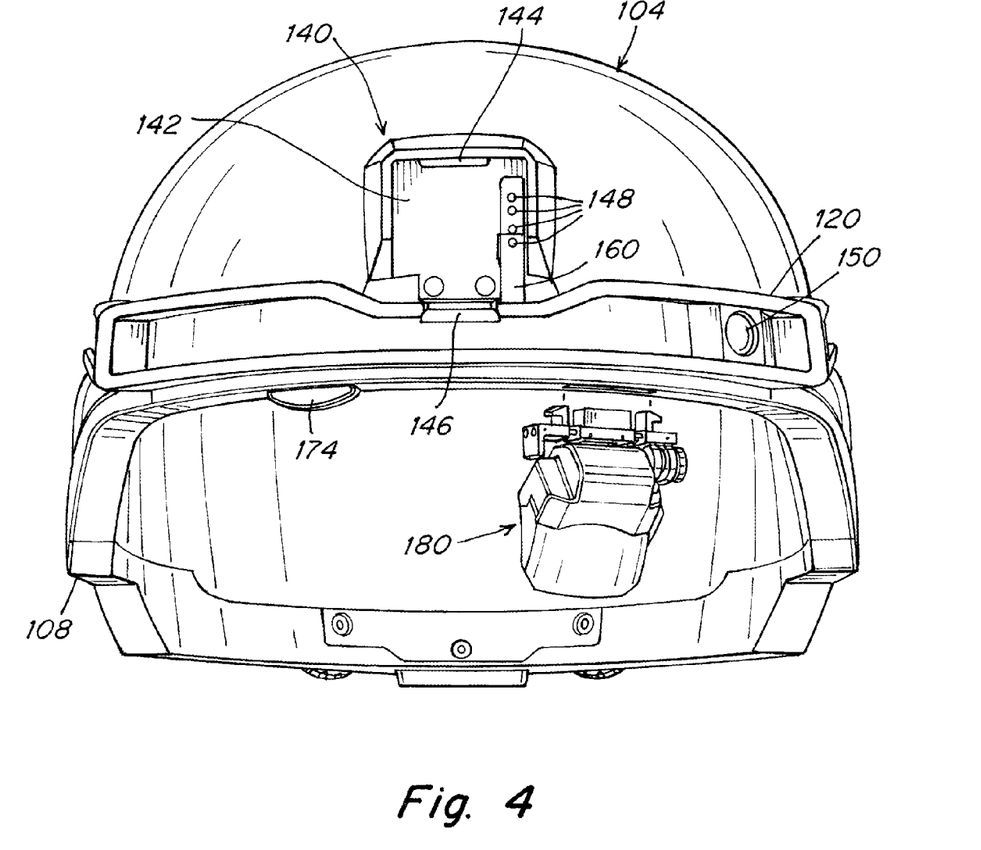
FIG. 4 is a front view of a helmet including a mount for a night vision goggle unit according to one embodiment.

One example of a physical connector and an electrical contact for an electronic device is shown in FIG. 4. A mount 140 for a device such as a night vision goggle unit (not shown) is positioned at the front and center of helmet 104 above a front halo 120. To physically connect the night vision goggle unit to the helmet, a mounting plate 142 is provided with an upper bracket 144 and a lower bracket 146. The night vision goggle unit includes a corresponding mounting portion which is inserted into the upper bracket and then pushed into the lower bracket until latched. Electrical contacts 148 are provided on the face of mounting plate 142 such that when the night vision goggle unit is physically attached to mount 140, the unit is electrically connected to the flexible printed circuit board. Contacts 148 also may provide a connection for data transfer to and/or from the night vision goggles.

Devices or components other than night vision goggle units may be attachable to mount 140 as well. For example, a visor may be attached to mount 140. A helmet-mounted display unit (not shown) may have a mounting portion which is similar the mounting portion of a night vision goggle unit, and be removably connectable to the helmet in a similar fashion. Enhanced night vision goggles may be used as well. A cover (not shown) for mounting plate 142 may be provided to protect mounting plate 142 when no device or component is attached to the helmet using mounting plate 142.

Other types of mounts may be provided on the front of the helmet for attachment and electrical connection of electronic devices as the invention is not limited to a specific mounting structure unless explicitly set forth in the claims.

Figure 5:
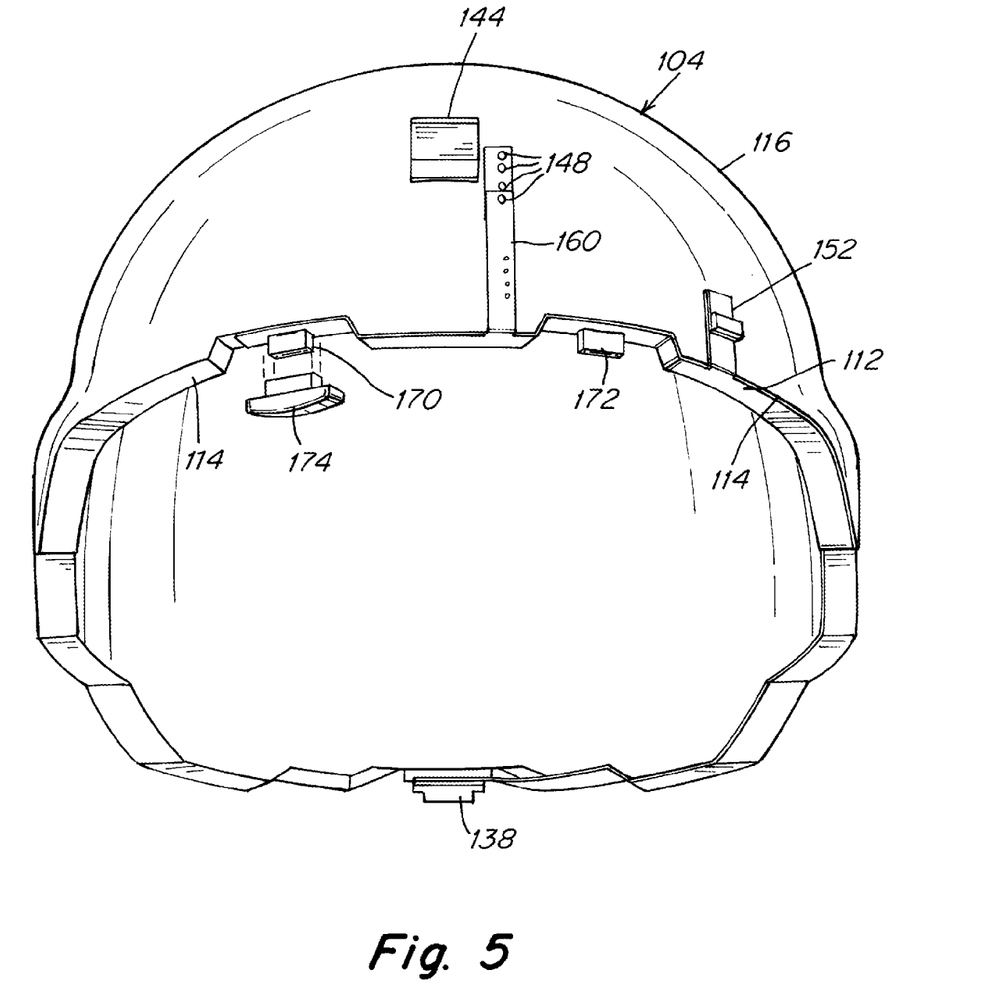
FIG. 5 is a front view of the embodiment illustrated in FIG. 4 showing ports for a helmet-mounted display unit according to one embodiment, a front halo and the night vision goggle unit mount being removed for purposes of illustration.

FIG. 5 shows a front view of helmet 104 with front halo 120 removed to show an extension 160 of flexible printed circuit board 112 which extends to contacts 148. Extension 160 may have fewer conductive leads relative to other portions of flexible printed circuit board 112 because extension 160 connects to only one device in some embodiments. However, multiple groups of contacts may be positioned on mount 140 such that when devices with various contact arrangements are attached to mount 140, the particular contacts that align with the device contacts are different for each device. In this manner, if certain devices can take advantage of certain conductive leads or contact types, mount 140 can provide options for the type of contacts and/or leads which are available.

FIG. 5 also shows two pin connectors 170, 172 which are positioned on a downwardly-facing surface of rim 114. In some embodiments, pin connectors 170, 172 are used for a helmet-mounted display unit. The helmet-mounted display unit may be selectively attached to helmet 104 for viewing by the wearer's right eye (pin connector 170) or left eye (pin connector 172). In some embodiments of helmets with a connector for a helmet-mounted display unit, only one connector for a helmet-mounted display unit is provided. A cover 174, shown attached to pin connector 170 in FIG. 5, may be used to protect a pin connector when a helmet-mounted display unit is not attached. In some embodiments, Glenair® Series 89 nanominiature connectors 891-006 (pin contacts) or 891-007 (socket contacts) may be used, as sold by Glenair®, Inc. of Glendale, Calif., though any suitable connector may be used. Connectors with 21 pins are used in some embodiments.

A helmet-mounted display 180 may be mounted to helmet 104 in some embodiments. Any suitable helmet-mounted display unit may be attached to pin connectors 170, 172, including embodiments disclosed in an application entitled, "Helmet-Mounted Display" filed on even date herewith, which is incorporated by reference herein in its entirety. In some embodiments, the pin connectors are used to physically connect the helmet-mounted display units or other devices to the helmet, while in other embodiments, a separate physical connection may be used. For example, a helmet-mounted display unit may include a squeeze clamp or other physical fastener which is attached to the helmet while pressing an electrical connector on the helmet-mounted display unit onto the pin connector of the helmet.

A power button 150 is provided on one side of front halo 120 to turn power on and off to mount 140 and/or to connectors 170, 172. Other power button or power selection arrangements are possible. An extension 152 of flexible printed circuit board 112 may extend to power button 150 as best seen in FIG. 2*a*.

A microprocessor or other controller may be included in the battery pack assembly, the helmet, and/or the flexible printed circuit board to control delivery of electricity to each of the various components mounted to the helmet. The controller may include software, hardware, and/or firmware to sense which devices are attached and/or the power requirements of the devices. The controller may distribute power at different currents and voltages based on device requirements and/or battery makeup.

Figure 6:
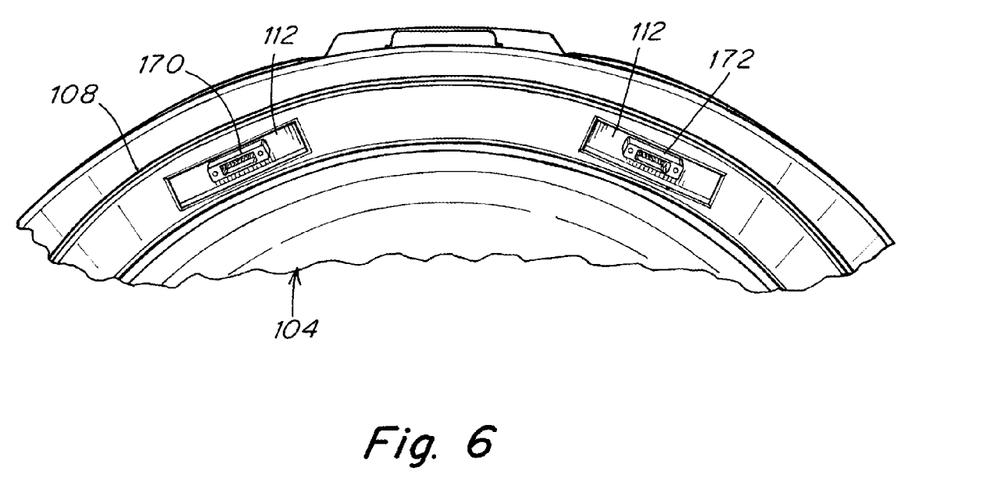
FIG. 6 is a bottom view of the front of the helmet showing the ports for a helmet-mounted display unit.

FIG. 6 shows a bottom view of pin connectors 170, 172 for a helmet-mounted display unit. Each connector includes 21 pins in some embodiments. The pin connectors (or socket connectors) may help provide physical connectivity of the helmet-mounted display unit to the helmet, or may provide all of the physical connectively, for example with threaded connections. In some embodiments, the helmet-mounted display unit may include a spring-loaded clamping arrangement to physically attach the unit to the helmet. In other embodiments, a helmet-mounted display unit or other electronic device may be more or less permanently mounted to the helmet. Pin or socket connectors need not be used in some embodiments as other suitable connectors may be employed.

It should be appreciated that various embodiments of the present invention may be formed with one or more of the above-described features. The above aspects and features of the invention may be employed in any suitable combination as the present invention is not limited in this respect. It should also be appreciated that the drawings illustrate various components and features which may be incorporated into various embodiments of the present invention. For simplification, some of the drawings may illustrate more than one optional feature or component. However, the present invention is not limited to the specific embodiments disclosed in the drawings. It should be recognized that the present invention encompasses embodiments which may include only a portion of the components illustrated in any one drawing figure, and/or may also encompass embodiments combining components illustrated in multiple different drawing figures.

It should be understood that the foregoing description of various embodiments of the invention are intended merely to be illustrative thereof and that other embodiments, modifications, and equivalents of the invention are within the scope of the invention recited in the claims appended hereto.

What is claimed is:

1. A method of manufacturing a protective helmet using a protective shell and a flexible printed circuit board, the protective shell having a downwardly facing rim portion, the method comprising acts of:
   (a) forming the flexible printed circuit board into a shape to match a contour of the rim portion of the protective shell;
   (b) positioning the flexible printed circuit board on the downwardly facing rim portion of the protective shell such that the flexible printed circuit board extends from a rear portion of the helmet to a front portion of the helmet; and
   (c) attaching an edge trim piece to the protective shell such that the edge trim piece overlies the flexible printed circuit board.

2. The method according to claim 1, wherein act (a) comprises forming the flexible printed circuit board into the matching shape by pressing the printed circuit board against the rim portion of the protective shell.

3. The method according to claim 1, wherein act (a) comprises forming the flexible printed circuit board into the matching shape by pressing the printed circuit board against a mold.

4. The method according to claim 1, further comprising, prior to act (a), heating the flexible printed circuit board to a temperature at which the flexible printed circuit board is pliable.

5. The method according to claim 1, further comprising electrically connecting the flexible printed circuit board to battery contacts.

6. The method according to claim 1, further comprising electrically connecting the flexible printed circuit board to data transfer contacts.

7. The method according to claim 1, further comprising:
   (d) installing one or more component contacts and electrically connecting the contacts to the flexible printed circuit board, each of the component contacts being configured to deliver electrical power and/or data to an electronic component.

8. The method according to claim 4, wherein at least one of the component contacts is configured to be attached to a helmet-mounted display unit.

9. The method according to claim 7, wherein (d) comprises installing the one or more component contacts such that the one or more component contacts is accessible for attachment of an electronic component at a downwardly-facing surface of a rim of the helmet.

10. The method according to claim 7, wherein (d) comprises installing the one or more component contacts such that the one or more contacts are accessible for attachment of an electronic component at a surface of the helmet.

11. A method of manufacturing a protective helmet using a protective shell and a flexible printed circuit board, the protective shell having a rim portion with an underside, the method comprising acts of:
    (a) forming the flexible printed circuit board into a shape to match a contour of the rim portion of the protective shell;
    (b) positioning the flexible printed circuit board on the underside of the rim portion of the protective shell; and
    (c) attaching an edge trim piece to the helmet such that the edge trim piece overlies the flexible printed circuit board.

12. The method according to claim 11, wherein act (a) comprises forming the flexible printed circuit board into the matching shape by pressing the printed circuit board against the rim portion of the protective shell.

13. The method according to claim 11, wherein act (a) comprises forming the flexible printed circuit board into the matching shape by pressing the printed circuit board against a mold.

14. The method according to claim 11, further comprising, prior to act (a), heating the flexible printed circuit board to a temperature at which the flexible printed circuit board is pliable.

15. The method according to claim 11, further comprising electrically connecting the flexible printed circuit board to data transfer contacts.

16. The method according to claim 11, further comprising:
  (d) installing one or more component contacts and electrically connecting the contacts to the flexible printed circuit board, each of the component contacts being configured to deliver electrical power and/or data to an electronic component.

17. The method according to claim 16, wherein (d) comprises installing the one or more component contacts such that the one or more component contacts is accessible for attachment of an electronic component at a downwardly-facing surface of a rim of the helmet.

18. The method according to claim 11, wherein (b) comprises positioning the flexible printed circuit board on the rim portion of the protective shell such that the flexible printed circuit board extends from a rear portion of the helmet to a front portion of the helmet.

\* \* \* \* \*